(12) United States Patent
Yun et al.

(10) Patent No.: US 6,344,676 B1
(45) Date of Patent: Feb. 5, 2002

(54) POWER SEMICONDUCTOR DEVICE HAVING LOW ON-RESISTANCE AND HIGH BREAKDOWN VOLTAGE

(75) Inventors: Chong-man Yun, Seoul; Tae-hoon Kim, Kyungki-do; Ho-cheol Jang; Young-chull Choi, both of Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/533,824

(22) Filed: Mar. 24, 2000

(30) Foreign Application Priority Data

Mar. 29, 1999 (KR) .............................................. 99-10799

(51) Int. Cl.⁷ .............................................. H01L 29/76
(52) U.S. Cl. ........................ 257/401; 257/327; 257/335; 257/341
(58) Field of Search ................................. 257/335–342, 257/327–329, 401

(56) References Cited

U.S. PATENT DOCUMENTS

| 4,072,975 A | 2/1978 | Ishitani |
| 4,145,700 A | 3/1979 | Jambotkar |
| 4,376,286 A | 3/1983 | Lidow et al. |
| 4,642,666 A | 2/1987 | Lidow et al. |
| 4,959,699 A | 9/1990 | Lidow et al. |
| 5,798,554 A | * 8/1998 | Grimaldi et al. ............ 257/401 |

FOREIGN PATENT DOCUMENTS

JP 10-290011 * 10/1998 ........... H01L/29/78

* cited by examiner

Primary Examiner—Tom Thomas
Assistant Examiner—Ori Nadav
(74) Attorney, Agent, or Firm—Volentine Francos, PLLC

(57) ABSTRACT

A power semiconductor device having low on-resistance and a high breakdown voltage is disclosed. The power semiconductor device can be a high power MOS transistor or an insulation gate bipolar transistor. The power semiconductor device has unit cells formed in parallel body region strips. A highly-doped drift layer of the same conductivity type as that of a drift region is provided between adjacent body region strips in a unit cell. Both ends of each of the body region strips of the unit cell are connected to a single frame region. This prevents a depletion region of a spherical or cylindrical type from being formed on an edge of the body region, and in so doing, increases a breakdown voltage of the device.

14 Claims, 5 Drawing Sheets

US 6,344,676 B1

1

POWER SEMICONDUCTOR DEVICE HAVING LOW ON-RESISTANCE AND HIGH BREAKDOWN VOLTAGE

This application relies for priority upon Korean Patent Application No. 99-10799, filed on Mar. 29, 1999, the contents of which are herein incorporated by reference in their entirety.

BACKGROUND OF THE INVENTION

The present invention relates to a power semiconductor device, and more particularly, to a high power MOS transistor of having a low on-resistance and a high breakdown voltage.

High power MOS transistors require a high breakdown voltage, a low on-resistance and a high switching speed. The on-resistance is made up of a channel resistance, a JFET resistance, an accumulation resistance, and a drift resistance. Of these, the drift resistance is directly related to the breakdown voltage.

FIG. 1 is a plan view of a group of high power MOS transistors, each having a conventional polygonal unit cell 100. Referring to FIG. 1, the hexagonal unit cells 100 are arranged such that they each have the same separation distance d, and such that the high power MOS transistors each have a high breakdown voltage and a low on-resistance.

FIG. 2 is a sectional view of the MOS transistors taken along the line II–II' of FIG. 1. Referring to FIG. 2, the MOS transistors include a drain region 200, a drain electrode 210, a drift layer 220, a plurality of body regions 230, a deep p+ region 232, a plurality of source regions 240, a gate insulating layer 250, a gate electrode 252, and a source electrode 260.

The drain region 200 and the drift layer 220 are both of a first conductivity type and the drift layer is formed on one side of the drain region 200. A plurality of body regions 230, of a second conductivity type, are formed in the upper regions of the drift layer 220. A pair of source regions 240, of the first conductivity type, are formed in each of the body regions 230. A deep p+ region 232 is then formed between each pair of source regions 240. A gate insulating layer 250 is formed on the surface of the body region 230 between adjacent body regions 230, at a point where a channel is to be formed during the operation of a device. A gate electrode 252 is formed on the gate insulating layer 250; a source electrode 260 is formed to be electrically connected to the source region 240; and a drain electrode 210 is formed to be electrically connected to the drain region 200.

As shown in FIG. 1, each cell has an inner segment 132 and a middle segment 160, and an outer segment 170. The outer segment 170 corresponds to the spacing between the gate electrode 252 and the source electrode 260, and has a width 'o.' The middle segment 160 corresponds to the overlap between the source electrode 260 and the source region 240, and has a width of 'm.' The inner segment 132 corresponds to the portion of the p+ body 232 that is not covered by the source region 240.

In a conventional high power MOS transistor, unit cells are formed in a polygonal shape to increase the channel density per unit area, so as to reduce the on-resistance of the device. However, when a high voltage is applied between a source electrode 260 and a drain electrode 210 in an off-state, a spherically-shaped depletion region is formed, which lowers the breakdown voltage. However, if the resistivity and the thickness of the materials of the device are increased

2 in an effort to increase the breakdown voltage of the device, the on-resistance of the device will be likewise increased.

With respect to the capacitive components of a conventional high power MOS transistor, the switching speed is determined by $C_{gd}$, i.e., the capacitance between the gate electrode 252 and the drain electrode 210. The value of $C_{gd}$ is determined by the area of the drift layer 220 between adjacent body regions 230 that is covered by the gate electrode 252. If this area is increased, $C_{gd}$ is also increased, reducing the switching speed of the device.

When a high power MOS transistor is formed of polygonal unit cells, the total area over which the gate electrode 252 covers the drift layer 220 between adjacent body regions 230 is increased. As a result, the high power MOS transistor has a high $C_{gd}$ value, and the switching speed of the device is reduced.

SUMMARY OF THE INVENTION

It is an objective of the present invention to provide a high power MOS transistor having a high breakdown voltage, a low on-resistance, and a high switching speed.

It is another objective of the present invention to provide an insulated gate bipolar transistor having a high breakdown voltage, a low on-resistance, and a high switching speed.

Accordingly, to achieve the above objectives, a power semiconductor device according to the present invention includes a drain region of a first conductivity type, a drift layer of the first conductivity type formed over a first surface of the drain region, a body region of a second conductivity type formed in the drift layer, the body region comprising a body frame region, and a plurality of parallel body strips, both ends of each of the plurality of body strips being connected to the frame region, a source region of the first conductivity type formed in the body region, having a depth more shallow than that of the body region, a source electrode formed over the source region, a drain electrode formed over a second surface of the drain region opposite to the first surface, a gate insulating layer formed over a channel region in the drift layer, and a gate electrode formed over the gate insulating layer.

The power semiconductor device may further comprise a highly-doped drift layer formed in the drift layer under the gate electrode. In this case, the highly-doped drift layer is doped more highly than the drift layer.

The distance between adjacent body strips is preferably sufficiently narrow to form a planar junction between the body strips, and the radius of curvature of a corner of the body region is preferably greater than or equal to 200 μm.

The first conductivity type is preferably n-type, but it may also be p-type. The power semiconductor device is preferably a high power MOS transistor.

To achieve the above objectives, a power semiconductor device according to the present invention may also include a collector region of a first conductivity type, a drift layer of a second conductivity type formed over the collector region, a base region of the first conductivity type formed in the drift layer, the base region comprising a base frame region, and a plurality of parallel base strips, both ends of each base strip being connected to a frame region, an emitter region of the second conductivity type formed in the base region, having an emitter depth more shallow than a base depth of the base region, a gate insulating layer formed over a channel region in the drift layer, and a gate electrode formed over the gate insulating layer.

The power semiconductor device may further comprise a highly-doped drift layer formed in the drift layer under the gate electrode. In this case, the highly-doped drift layer is doped more highly than the drift layer.

The distance between adjacent base strips is preferably sufficiently narrow to form a planar junction at corners of the base strips, and the radius of curvature of a corner of the base region is preferably greater than or equal to 200 μm.

The first conductivity type is preferably p-type, but may also be n-type. The power semiconductor device is preferably an insulated gate bipolar transistor.

The power semiconductor device according to the present invention has a low on-resistance, a high breakdown voltage and a high switching speed.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
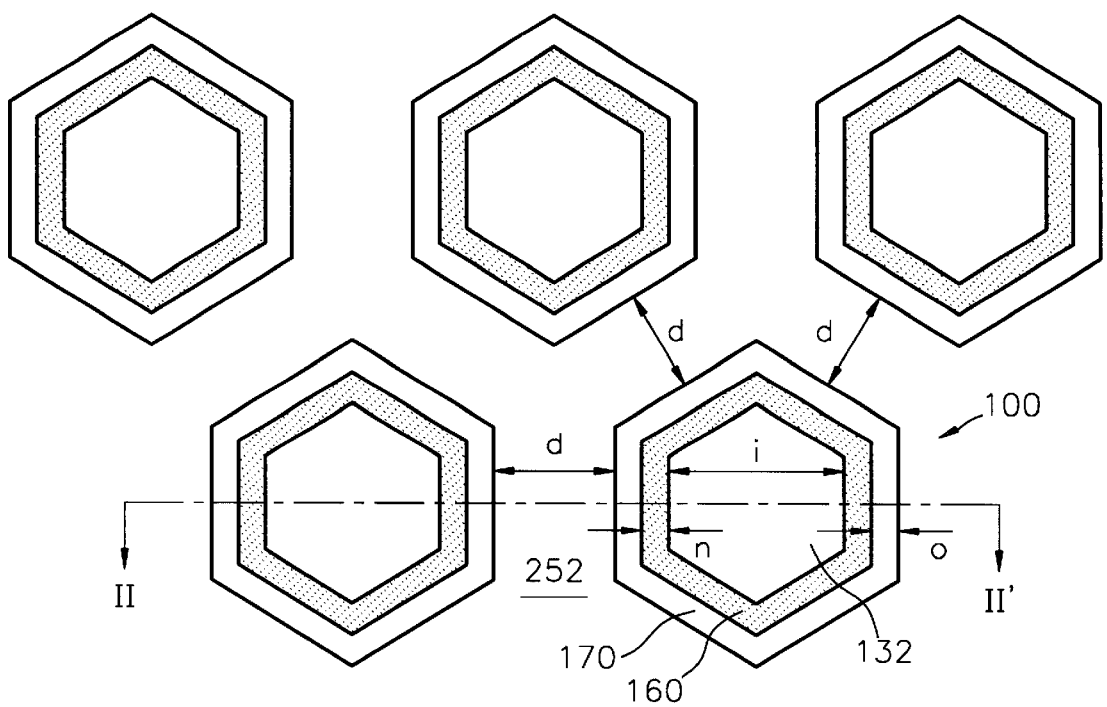
FIG. 1 is a layout diagram of a conventional high power MOS transistors having polygonal unit cells.
Figure 2:
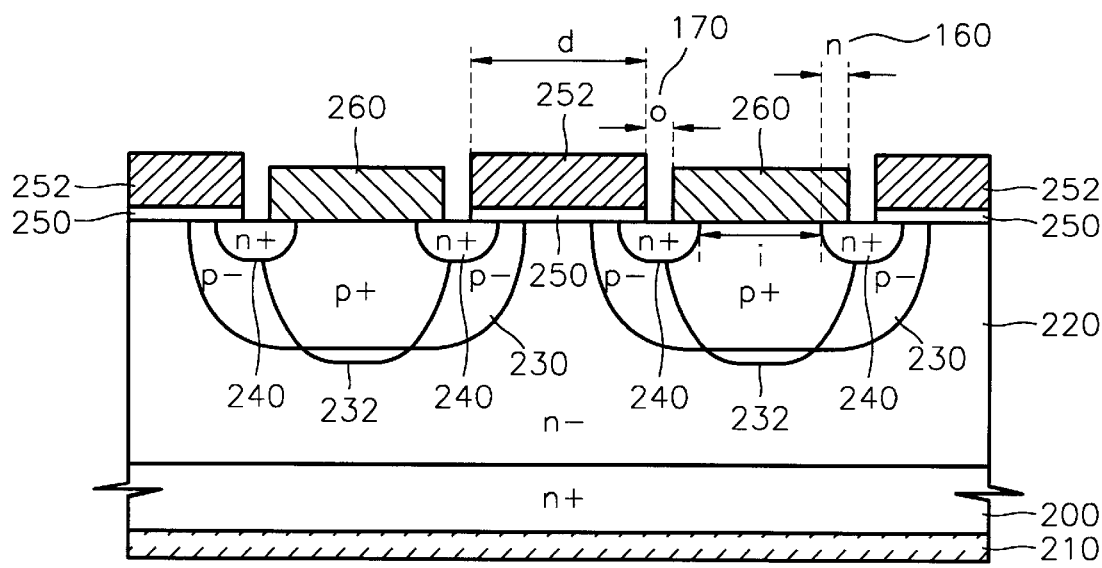
FIG. 2 is a sectional view of the MOS transistor taken of FIG. 1, along line II–II'.

In a high-power MOS transistor, the breakdown voltage is formed at the depletion region boundary. As a result, the breakdown voltage varies in accordance with the junction structure, as described below.

First, it is necessary to look at the ideal breakdown voltage $BV_{pp}$ of an infinite plane. This ideal breakdown voltage $BV_{pp}$ is determined by Equation 1, $$BV_{pp} = 5.34 \times 10^{13} \left( N_a^{-\frac{3}{4}} \right) \quad (1)$$

where, $N_a$ indicates a doping concentration of a drift layer.

As shown by equation 1, the ideal breakdown voltage $BV_{pp}$ of a junction having an infinite plane type depletion region depends only upon the doping concentration $N_a$ of the region.

In contrast, the breakdown voltage of a punch-through type junction $BV_{pt}$ is determined by Equation 2, $$BV_{pt} = 4010 \left( N_a^{\frac{1}{8}} \right) (W_p) - 0.5 \left( \frac{qN_aW_p^2}{\varepsilon_s} \right) \quad (2)$$

where $W_p$ indicates the thickness of the drift layer, and $\varepsilon_s$ indicates a dielectric constant.

Thus, the breakdown voltage of a punch-through type junction $BV_{pt}$ depends upon both the concentration and the thickness of the drift layer. As a result, the breakdown voltage in this case depends on both the form of the junction structure as well as its impurity concentration.

The breakdown voltage of a junction which has a spherically shaped depletion region will now be described. When a high voltage is applied to a power MOS transistor having polygonal unit cells, a spherical junction is formed at each of the corners. An electric field is concentrated in a portion where the radius of curvature is smallest, so that the breakdown voltage changes according to the junction depth as well as according to the characteristics of a material. The breakdown voltage of a spherical junction structure $BV_{sp}$ is expressed by Equation 3, $$BV_{sp} = BV_{pp} \left\{ \left( \frac{r_j}{W_c} \right)^2 + 2.14 \left( \frac{r_j}{W_c} \right)^{\frac{6}{7}} - \left[ \left( \frac{r_j}{W_c} \right)^3 + 3 \left( \frac{r_j}{W_c} \right)^{\frac{13}{7}} \right]^{\frac{2}{3}} \right\} \quad (3)$$

where, $r_j$ indicates the junction depth, and $W_c$ indicates the critical depletion depth.

For expected values of $r_j$ and $W_c$, equation 3 shows that the breakdown voltage of a spherical junction structure $BV_{sp}$ is much lower than the ideal breakdown voltage $BV_{pp}$.

The breakdown voltage of a cylindrical junction will now be described. In a linear unit cell, a body region where unit cells are formed, is linear. Thus, when the distance between adjacent body regions is large, the depletion region expands with a cylindrical shape. The breakdown voltage of a cylindrical junction $BV_{cyl}$ is expressed by Equation 4, $$BV_{cyl} = BV_{pp} \left\{ \frac{1}{2} \left[ \left( \frac{r_j}{W_c} \right)^2 + 2 \left( \frac{r_j}{W_c} \right)^{\frac{6}{7}} \right] \cdot \ln \left[ 1 + 2 \left( \frac{W_c}{r_j} \right)^{\frac{8}{7}} \right] - \left( \frac{r_j}{W_c} \right)^{\frac{6}{7}} \right\} \quad (4)$$

Referring to Equations 1–4, for expected parameters, the breakdown voltage of a cylindrical junction $BV_{cyl}$ is higher than the breakdown voltage of a spherical junction $BV_{sp}$, but lower than the ideal breakdown voltage $BV_{pp}$. As a result, when a device has both a spherical junction and a cylindrical junction, the breakdown voltage of the device is much lower than the ideal breakdown voltage, as compared to a planar junction. To compensate for the lowered breakdown voltage, an increase in the resistivity and thickness of the drift layer is required. However, when the resistivity and the thickness of the drift layer are increased, the on-resistance is correspondingly increased.

Thus, a method for forming a body region in which a device has no spherical and cylindrical junctions is required, so that the breakdown voltage of a device approaches the ideal breakdown voltage $BV_{pp}$.

First Preferred Embodiment

The structure and operation of a high power MOS transistor in accordance with a first preferred embodiment of the present invention will be described below with reference to FIGS. 3 to 7.

Figure 3:
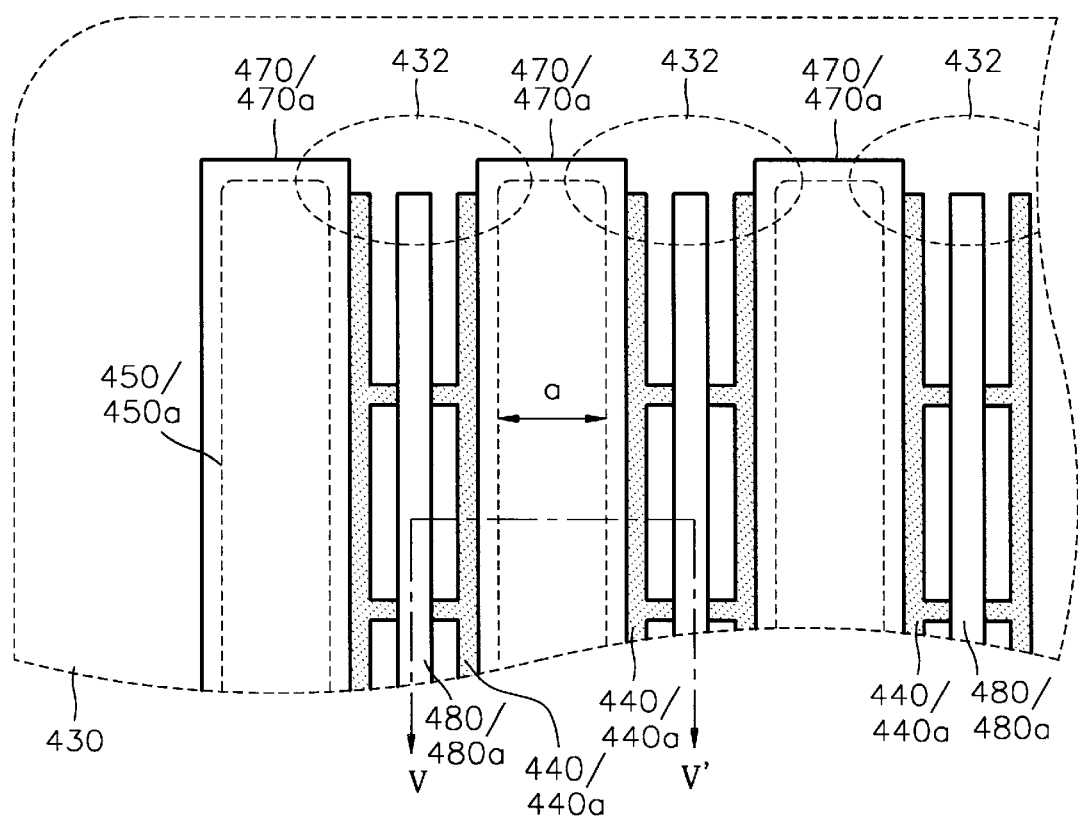
FIG. 3 is a layout diagram of a high-power MOS transistor according to first and second preferred embodiments of the present invention, in which unit cells are strip-shaped.

In FIG. 3, reference numeral 430 indicates a body region and a frame region pattern, reference numeral 432 indicates an end region within the body and frame region pattern 430, reference numeral 440 indicates a source region pattern, reference numeral 450 indicates a highly-doped drift layer, reference numeral 470 indicates a gate electrode pattern, and reference numeral 480 indicates a source contact.

Figure 4:
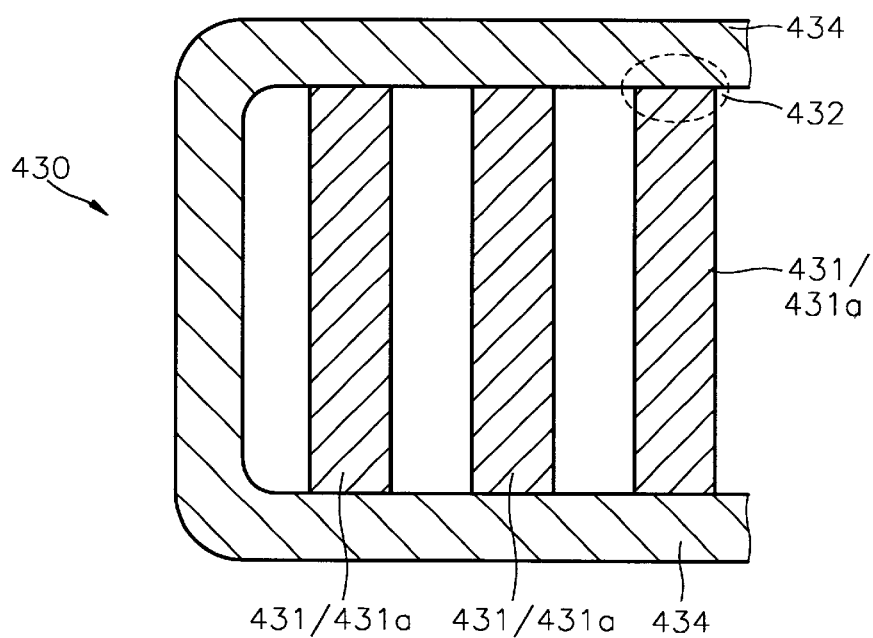
FIG. 4 is a layout diagram of a body region pattern and a frame region pattern according to the first and second preferred embodiments of the present invention.

FIG. 4 is a layout diagram of the same body region and frame region pattern 430 of FIG. 3, but showing a different aspect. In FIG. 4, a body region pattern includes a plurality of body regions 431 formed in parallel within a frame region 434. Each body region 431 is connected to the frame region 434 on either end by an end region 432. As a result, each body region 431 is connected to all of the other body regions 431 through the frame region 434. These end regions 432 are the same end regions 432 shown in FIG. 3, and the body regions 431 and the frame region 434 are formed underneath the gate electrodes and the source electrodes 480 of FIG. 3.

Figure 5:
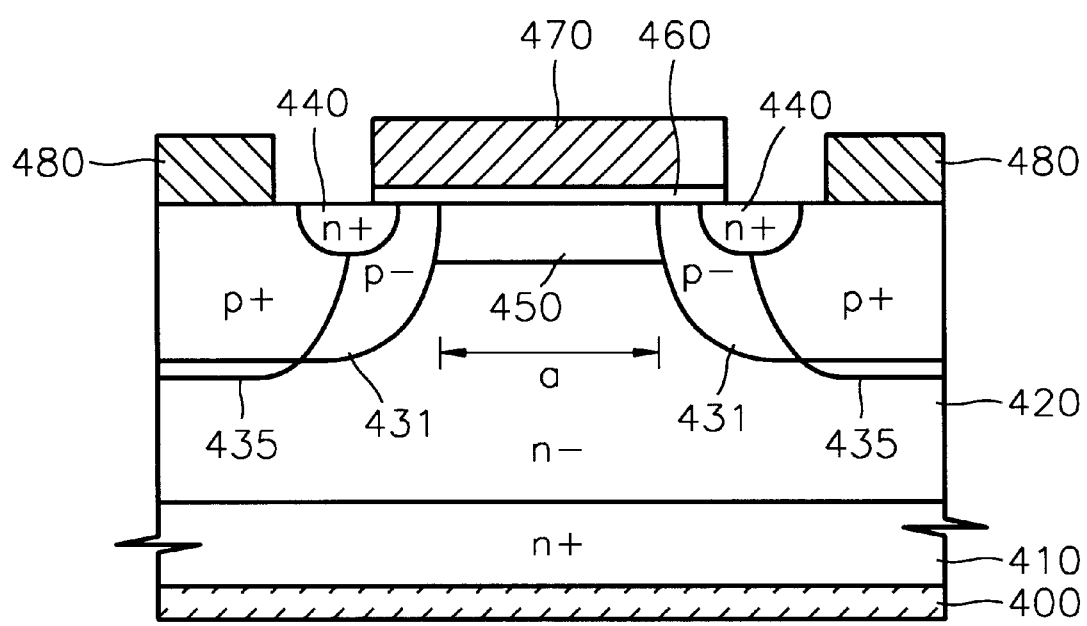
FIG. 5 is a sectional view of the high-power MOS transistor of FIG. 3, taken along line V–V' according to the first preferred embodiment of the present invention.

Referring to FIG. 5, a high power MOS transistor includes a drain electrode 400, a drain region 410, a drift layer 420, a body region 431, a highly-doped deep region 435, a source region 440, a highly-doped drift layer 450, a gate insulating layer 460, a gate electrode 470, and a source electrode 480.

Preferably, the drain region 410 is formed of a semiconductor substrate of a first conductivity type, and is highly doped. The first conductivity type is preferably n-type.

The drift layer 420 is formed over a surface of the drain region 410. Preferably, the drift layer 420 is also of the first conductivity type, but is doped more lightly than the drain region 410.

The body region 431 is formed in the drift layer 420, with adjacent body regions 431 being spaced apart by an interval a. Preferably the body region 431 is a second conductivity type, and is lightly doped. The second conductivity type is preferably p-type. The body region 431 is preferably formed in parallel strips, with each end of a given strip being connected to a frame region (as shown in FIG. 4). As a result, each strip in the body regions 431 is connected to each other strip in the body region 431 through the frame region 434. (See, FIG. 4.)

In the conventional polygonal unit cells, an electric field is concentrated on the corner region to reduce a breakdown voltage. However, corners of the striped body region 431 have a negative curvature. As a result, the electric field is not concentrated in the corner of the body region 431, which prevents a reduction of the breakdown voltage.

Preferably, the radius of curvature of the corner region of the body region 431 is 200 $\mu$m or more, such that no spherical type depletion region is formed in the corner region of the body region 431. Also, the interval a between the body regions 431 is preferably sufficiently narrow that a plane junction is formed.

The source region 440 is formed in the body region 431. Preferably the source region 440 is of the first conductivity type, and is more shallow than the body region 431. The source region 440 is preferably doped more highly than the drift layer 420.

The highly-doped deep region 435 is preferably provided adjacent to each of the source regions 440. Preferably these highly-doped deep regions 435 have the same conductivity type as the body region 431 and are doped more highly than the body region 431, i.e., they are preferably p$^+$ regions. The highly-doped deep region 435 is also preferably deeper than the body region 431.

The highly-doped drift layer 450 is formed in the drift layer 420 between the body regions 431, i.e., in the drift layer 420 under the gate electrode 470. Preferably, the highly-doped drift layer 450 is of the same conductivity type as the drift layer 420, and is doped more highly than the drift layer 420. The depth of the highly-doped drift layer 450 is preferably less than or equal to the depth of the body region 431. The highly-doped drift layer 450 operates to reduce the JFET resistance components that cause the on-resistance.

The gate electrode 470 is preferably formed in a region where the highly-doped drift layer 450 and a channel are formed, with the gate insulating layer 460 interposed between the highly doped drift layer 450 and the gate electrode 470.

The drain electrode 400 is preferably formed on a surface opposite to the surface of the drain region 410 where the drift layer 420 is formed.

Figure 6:
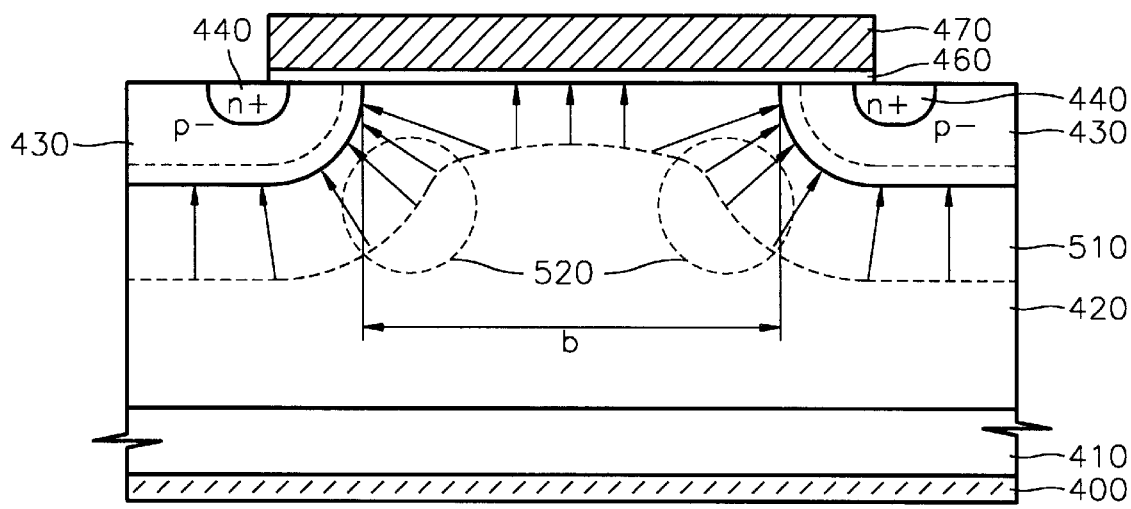
FIG. 6 is a sectional view of a depletion region of a high-power MOS transistor having body regions widely spaced apart from each other.

Preferably, the interval a between the body regions 431 is sufficiently narrow that a planar junction is formed. FIG. 6 is a sectional view of a high power MOS transistor having a wide interval b between body regions. In this case, a depletion region 510 is formed around the junction of the body regions. The interval b between the body regions is sufficiently wide that a spherical junction is formed at the corners of the body region 431, as shown by the area 520. The arrows of FIG. 6 indicate the direction of the electric field. As shown in FIG. 6, the electric field is concentrated near the corners of the body region, so that a breakdown voltage of the cylindrical junction is lower than that of the planar junction.

Figure 7:
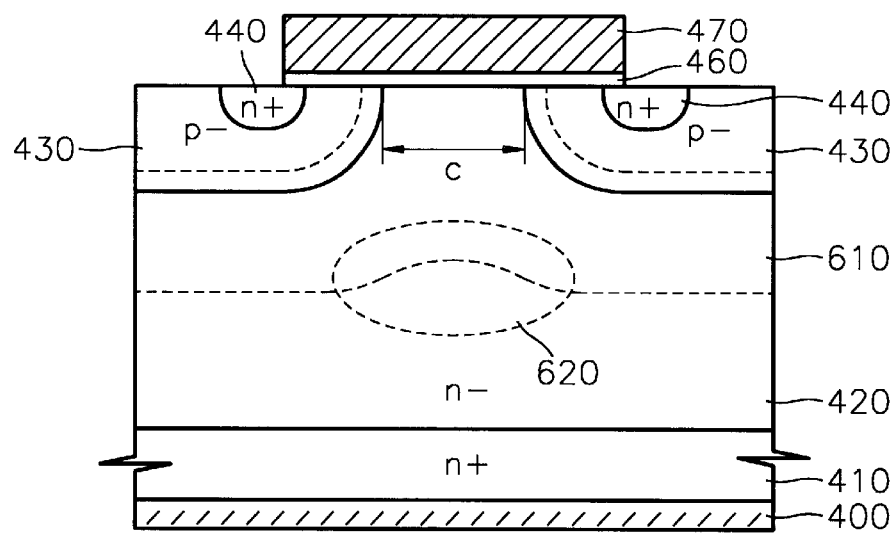
FIG. 7 is a sectional view of a depletion region of a high-power MOS transistor having body regions narrowly spaced apart from each other.

FIG. 7 is a sectional view of a high power MOS transistor having a narrow interval c between body regions. The distance c between body regions is sufficiently narrow that the shape of a junction at the corners of the body region 431 closely resembles a plane, as shown by the area 620. Thus, the electric field is not concentrated at the corner of the body region, and so the breakdown voltage is close to the ideal breakdown voltage.

According to the high power MOS transistor of the present invention, the interval between body regions is narrow. As the distance between the body regions becomes narrower, the area of the gate electrode becomes smaller. Since the capacitance $C_{gd}$ between the gate electrode and the drain electrode is proportional to the area of the gate electrode, $C_{gd}$ can be reduced. As a result, the switching speed of the device can be increased.

However, as a distance between the body regions is reduced, the resistance components of the JFET region increase. To reduce the resistance of the JFET region, a highly-doped drift layer is further formed between body regions under a surface of the drift layer.

Second Preferred Embodiment

Figure 8:
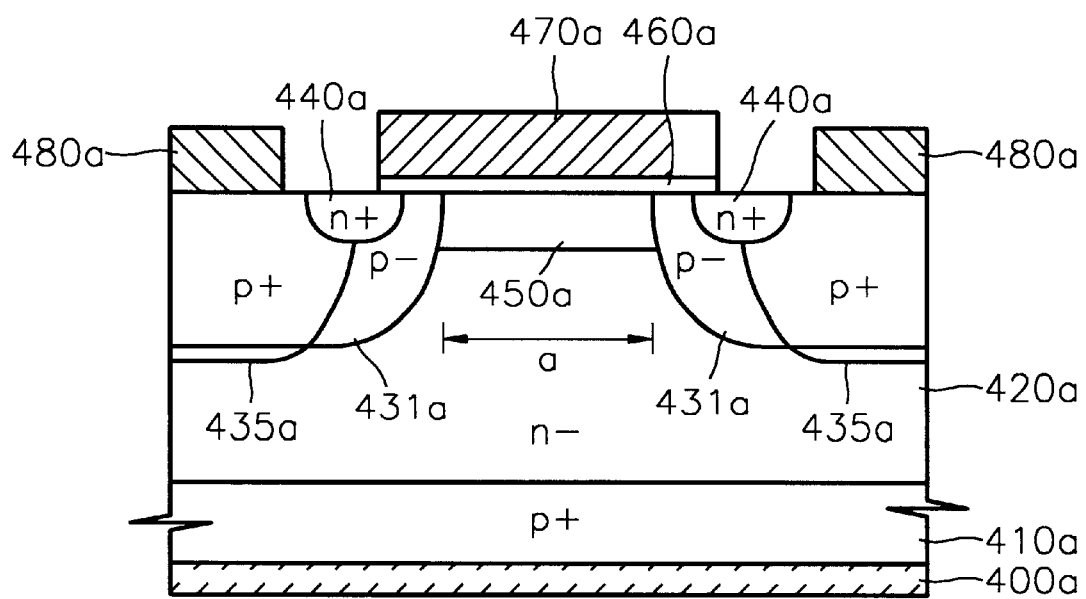
FIG. 8 is a sectional view of the high-power MOS transistor of FIG. 3, taken along line V–V' according to the second preferred embodiment of the present invention.

The structure and operation of an insulated gate bipolar transistor in accordance with a second preferred embodiment of the present invention will be described below with reference to FIGS. 3, 4, and 8.

The structure of an insulated gate bipolar transistor is substantially the same as that of the MOS transistor of the first preferred embodiment, except for the conductivity of a drain region. This structure will be described in more detail below. Portions which were presented in the first preferred embodiment will not be described.

An insulated gate bipolar transistor according to the present invention includes a collector region 410a, a drift layer 450a, a base region 431a, an emitter region 440a, a gate insulating layer 460a, a base electrode 470a, an emitter electrode 480a, and a collector electrode 400a.

Preferably, the collector region 410a is formed of a semiconductor substrate of the second conductivity type, and is highly doped. As noted above, the second conductivity type is preferably of p-type, so the collector region 410a is preferably of p$^+$-type.

The drift layer 450a is formed over a surface of one side of the collector region 410a. Preferably, the drift layer 450a is of the first conductivity type, i.e., n-type, and is doped more lightly than the collector region, i.e., it is preferably n$^-$-type.

A base region 431a is formed in the drift layer 450a. Preferably, the base region 431a is of the second conductivity type, and is lightly doped, i.e., it is preferably of p$^-$-type. Also, the base region 431a is preferably formed of a plurality of parallel strips, with both ends of each strip being connected to the frame region 434. As a result, each of the strips of the base region 431a is connected to all of the other strips through the frame region 434.

In the conventional polygonal unit cell, the electric field is concentrated in the corner to reduce the breakdown voltage. However, according to the present invention, corners of the striped base region 431a have a negative curvature. Thus, the electric field is not concentrated in the corner of the base region 431a, and a reduction of the breakdown voltage is prevented.

According to the high power semiconductor device of the present invention, the base region 431a is striped and both ends of each strip in the base region 431a are connected to the frame region 434. This prevents the electric field from being concentrated at the edge and in the corner of the body region 431a. As a result, the breakdown voltage in the resulting structure approximates the ideal breakdown voltage.

Also, the distance between the base regions 431a is narrow, so that a planar junction is formed in the corners of the base region 431a, thereby increasing the breakdown voltage of the device. In addition, the interval between the base regions 431a is narrow, so that an area of the base electrode 470a is smaller, thereby reducing the capacitance between the base electrode 470a and the collector electrode 400a.

As a result of these features, the switching speed of the device is increased. A highly-doped drift layer 435a is further included on a surface of the drift layer 450a, so that the JFET resistance components can be reduced, to thereby reduce the on-resistance of the device.

What is claimed is:

1. A power semiconductor device comprising:
    a drain region of a first conductivity type having a first surface and a second surface opposite the first surface;
    a drift layer of the first conductivity type having a first surface formed over the first surface of the drain region and a second surface opposite the first surface of the drift layer;
    a body region of a second conductivity type formed in the second surface of the drift layer, the body region comprising (a) a plurality of parallel elongate body strips extending lengthwise along the second surface of the drift layer at a first depth within the drift layer, and (b) a body frame region at least partially surrounding the plurality parallel elongate body strips and commonly connecting ends of the plurality of parallel elongate body strips;
    first and second elongate source regions of the first conductivity type extending parallel to the plurality of elongate body strips within each of at least one of the plurality of parallel elongate body strips of the body region, the first and second elongate source regions defining an elongate gap therebetween and having a second depth which is more shallow than the first depth;
    at least one source connecting region extending perpendicularly between and connected to the first and second elongate source regions;
    an elongate source electrode extending lengthwise within the elongate gap and parallel to and spaced from the first and second elongate source regions and crossing over the at least one source connecting region;
    a drain electrode formed over the second surface of the drain region;
    a gate insulating layer formed over a channel region in the drift layer; and
    a gate electrode formed over the gate insulating layer.

2. A power semiconductor device, as recited in claim 1, further comprising a highly-doped drift layer formed in the drift layer under the gate electrode, wherein the highly-doped drift layer is doped more highly than the drift layer.

3. A power semiconductor device, as recited in claim 1, wherein the distance between adjacent body strips is sufficiently narrow to form a planar junction between the body strips.

4. A power semiconductor device, as recited in claim 1, wherein the radius of curvature of a corner of the body region is greater than or equal to 200 μm.

5. A power semiconductor device, as recited in claim 1, wherein the first conductivity type is n-type.

6. A power semiconductor device, as recited in claim 1, wherein the first conductivity type is p-type.

7. A power semiconductor device, as recited in claim 1, wherein the power semiconductor device is a high power MOS transistor.

8. A power semiconductor device comprising:
    a collector region of a first conductivity type having a first surface and a second surface opposite the first surface;
    a drift layer of a second conductivity type having a first surface formed over the first surface of the collector region and a second surface opposite the first surface of the drift layer;
    a base region of the first conductivity type formed in the second surface of the drift layer, the base region comprising (a) a plurality of parallel elongate base strips extending lengthwise along the second surface of the drift layer at a first depth within the drift layer, and (b) a base frame region at least partially surrounding the plurality parallel elongate base strips and commonly connecting ends of the plurality of parallel elongate base strips;
    first and second elongate emitter regions of the second conductivity type extending parallel to the plurality of elongate base strips within each of at least one of the plurality of parallel elongate base strips of the base region, the first and second elongate emitter regions defining an elongate gap therebetween and having an emitter depth which is more shallow than the first depth;
    at least one emitter connecting region extending perpendicularly between and connected to the first and second elongate emitter regions;
    an elongate emitter electrode extending lengthwise within the elongate gap and parallel to and spaced from the first and second elongate emitter regions and crossing over the at least one emitter connecting region;

an insulating layer formed over a channel region in the drift layer; and an electrode formed over the insulating layer.

9. A power semiconductor device, as recited in claim 8, further comprising a highly-doped drift layer formed in the drift layer under the gate electrode, wherein the highly-doped drift layer is doped more highly than the drift layer.

10. A power semiconductor device, as recited in claim 8, wherein the distance between adjacent base strips is sufficiently narrow to form a planar junction at corners of the base strips.

11. A power semiconductor device, as recited in claim 8, wherein the radius of curvature of a corner of the base region is greater than or equal to 200 $\mu$m.

12. A power semiconductor device, as recited in claim 8, wherein the first conductivity type is n-type.

13. A power semiconductor device, as recited in claim 8, wherein the first conductivity type is p-type.

14. A power semiconductor device, as recited in claim 8, wherein the power semiconductor device is an insulated gate bipolar transistor.

* * * * *